United States Patent
Guillemin et al.

(10) Patent No.: US 11,988,690 B2
(45) Date of Patent: May 21, 2024

(54) CURRENT TRANSDUCER

(71) Applicant: LEM International SA, Meyrin (CH)

(72) Inventors: Thomas Guillemin, Sillingy (FR); Fabien Millet, Bons-en-chablais (FR)

(73) Assignee: LEM International SA, Meyrin (CH)

( * ) Notice: Subject to any disclaimer, the term of this patent is extended or adjusted under 35 U.S.C. 154(b) by 0 days.

(21) Appl. No.: 18/283,160

(22) PCT Filed: Mar. 4, 2022

(86) PCT No.: PCT/EP2022/055576
§ 371 (c)(1),
(2) Date: Sep. 20, 2023

(87) PCT Pub. No.: WO2022/200016
PCT Pub. Date: Sep. 29, 2022

(65) Prior Publication Data
US 2024/0085462 A1    Mar. 14, 2024

(30) Foreign Application Priority Data
Mar. 23, 2021    (EP) .................................... 21164334

(51) Int. Cl.
*G01R 33/02*    (2006.01)
*G01R 15/18*    (2006.01)
(Continued)

(52) U.S. Cl.
CPC ......... *G01R 15/185* (2013.01); *G01R 15/207* (2013.01); *G01R 33/02* (2013.01);
(Continued)

(58) Field of Classification Search
CPC .... G01R 15/185; G01R 15/207; G01R 33/02; G01R 33/093; G01R 33/07; B82Y 25/00; B82Y 35/00; B82Y 40/00
(Continued)

(56) References Cited

U.S. PATENT DOCUMENTS

| 2005/0211381 A1 | 9/2005 | Turner |
| 2008/0048655 A1* | 2/2008 | Hausperger .......... G01R 15/185 324/260 |

(Continued)

FOREIGN PATENT DOCUMENTS

CN    107817458    3/2018

OTHER PUBLICATIONS

International Search Report and Written Opinion as issued by the International Searching Authority, dated Jun. 14, 2022, for International Patent Application No. PCT/EP2022/055576; 13 pages.

*Primary Examiner* — Raul J Rios Russo
(74) *Attorney, Agent, or Firm* — Faegre Drinker Biddle & Reath LLP

(57) ABSTRACT

A current transducer comprising a housing including a base and a cover, a magnetic circuit mounted within a cavity of the base, the magnetic circuit comprising a magnetic core and a least one coil wound around the magnetic core, and an electric circuit comprising a first circuit board mounted within the housing, the first circuit board comprising a signal processing circuit connected to the magnetic field detector and to the coil. The transducer further comprises a second circuit board comprising one or more power amplifiers mounted thereon, the second circuit board being integrated within an inner side of a metallic support substrate forming an outer layer of said cover, the metallic support substrate fixed to the housing base to cover the cavity therein with the second circuit board forming an inner side of the cover facing the first circuit board, the first and second boards interconnected electrically by electrical interconnections.

7 Claims, 3 Drawing Sheets

(51) Int. Cl.
    *G01R 15/20*     (2006.01)
    *G01R 33/07*     (2006.01)
    *G01R 33/09*     (2006.01)
    *B82Y 25/00*     (2011.01)
    *B82Y 35/00*     (2011.01)
    *B82Y 40/00*     (2011.01)

(52) U.S. Cl.
    CPC ............ *G01R 33/07* (2013.01); *G01R 33/093* (2013.01); *B82Y 25/00* (2013.01); *B82Y 35/00* (2013.01); *B82Y 40/00* (2013.01)

(58) Field of Classification Search
    USPC ........................................................ 324/244
    See application file for complete search history.

(56) References Cited

U.S. PATENT DOCUMENTS

| | | | |
|---|---|---|---|
| 2015/0309081 A1* | 10/2015 | Kymissis | G01R 3/00 29/605 |
| 2017/0059627 A1* | 3/2017 | Polley | G01R 15/185 |
| 2020/0379017 A1 | 12/2020 | Claeys | |

\* cited by examiner

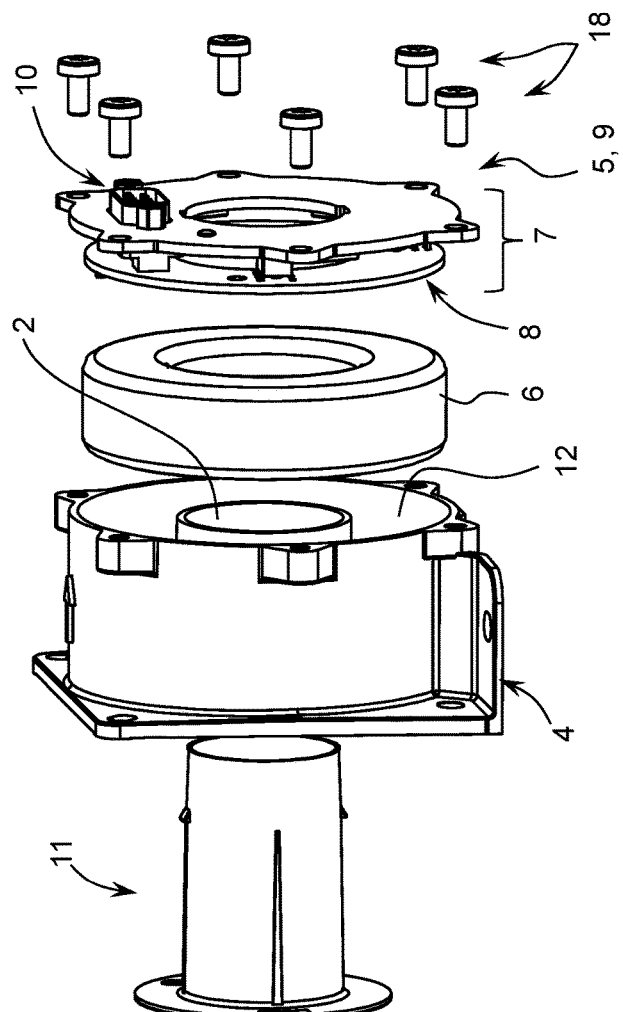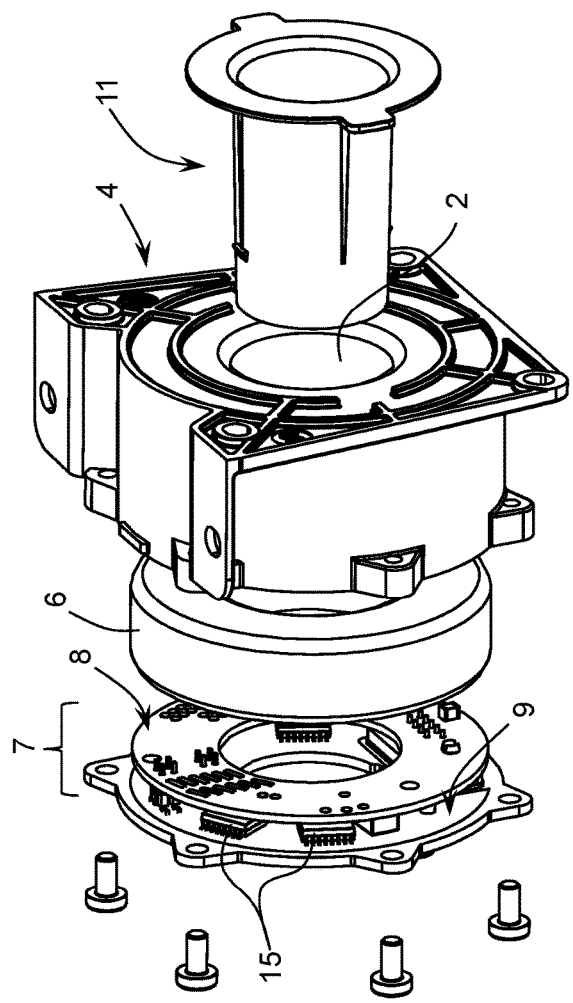

CURRENT TRANSDUCER

CROSS-REFERENCE TO RELATED APPLICATIONS

The present application is a national stage entry of International (PCT) Patent Application Number PCT/EP2022/055576, filed Mar. 4, 2022, which claims priority to European Patent Application Number 21164334.1, filed Mar. 23, 2021, the complete disclosures of which are expressly incorporated herein by reference.

The present invention relates to an electrical current transducer with a magnetic core and central passage for a primary conductor to pass therethrough. The transducer may in particular be of the closed-loop type with a compensation coil wound around the magnetic core.

Current transducers having a magnetic core with a central passage through which a primary conductor carrying a current to be measured extends, are well-known. Current transducers of the closed-loop type comprising a compensation coil would around the magnetic core are also well known. A magnetic field detector such as a Hall effect sensor, or a fluxgate sensor, or other types of magnetic field detectors are mounted in an airgap of the magnetic core, or mounted in proximity to the magnetic core to pick up the magnetic field generated by the primary current and captured by the magnetic core.

In transducers of the closed-loop type, the magnetic field detector is connected to an electronic circuit and drives the compensation coil in a feedback loop to generate a magnetic field in opposition to the magnetic field generated by the primary current, such that these fields cancel each other out. The current driving the compensation current in the compensation coil may be measured and represents a value proportional to the current to be measured. For the measurement of large current values, generation of the compensation current may require one or more power amplifiers mounted within the current transducer such power amplifiers generating heat that needs to be evacuated, the extent to which depends on the size of the transducer, the amplitude of the current, and the implementation of the current transducer in specific applications. It is also preferable to reduce the heat generated by the power amplifiers from affecting other portions of the electronic circuit, in particular the signal processing elements for processing the magnetic field detector signals and the generation of the feedback loop.

In conventional current transducers, the problem of heat generation within current transducers may be resolved by appropriate dimensioning of the current transducers (in particular having a large current transducer) and by connecting the circuit boards on which the power amplifiers are mounted to thermal bridge elements connected to the transducer housing or cooling elements positioned on the outside of the housing. These measures however render the transducer bulky and costly.

It is an object of the invention to provide a closed-loop current transducer that is compact and able to measure large amplitude primary currents in a reliable and accurate manner.

It is advantageous to provide a closed-loop current transducer that operates at stable temperatures.

It is advantageous to provide a closed-loop current transducer that can be implemented in harsh operating environments while remaining reliable and accurate.

It is advantageous to provide a current transducer that is economical to manufacture.

Objects of the invention have been achieved by providing the current transducer according to claim 1.

Disclosed herein a current transducer comprising a housing including a base and a cover, a magnetic circuit mounted within a cavity of the base, the magnetic circuit comprising a magnetic core and a least one coil wound around the magnetic core, and an electric circuit comprising a first circuit board mounted within the housing, the first circuit board comprising a signal processing circuit connected to the magnetic field detector and to the coil. The transducer further comprises a second circuit board comprising one or more power amplifiers mounted thereon, the second circuit board being integrated on an inner side of a metallic support substrate forming an outer layer of said cover, the metallic support substrate fixed to the housing base to cover the cavity therein with the second circuit board forming an inner side of the cover facing the first circuit board, the first and second boards interconnected electrically by electrical interconnections.

In an advantageous embodiment, the current transducer is a closed-loop current transducer and the coil is a compensation coil configured for carrying a compensation current seeking to cancel a magnetic field generated by the current to be measured.

In an advantageous embodiment, the metallic support substrate is a flat sheet of metal.

In an advantageous embodiment, the second circuit board comprises a flat insulating substrate.

In an advantageous embodiment, the metallic support substrate is made of aluminum or aluminum alloy.

In an advantageous embodiment, the electronic circuit comprises one or more spacer elements mounted between the first and second circuit boards to define and stabilize a gap (G) therebetween.

In an advantageous embodiment, the transducer further comprises a connector mounted on the first circuit board and extending therefrom through the second circuit board and metallic support substrate having an orifice therefor, presenting a pluggable interface or connection to an external connector.

Further objects and advantageous features of the invention will be apparent from the claims, from the detailed description, and annexed drawings, in which:

FIGS. 2a and 2b are perspective exploded views of the current transducer embodiment illustrated in FIGS. 1a and 1b;

Figure 1A:
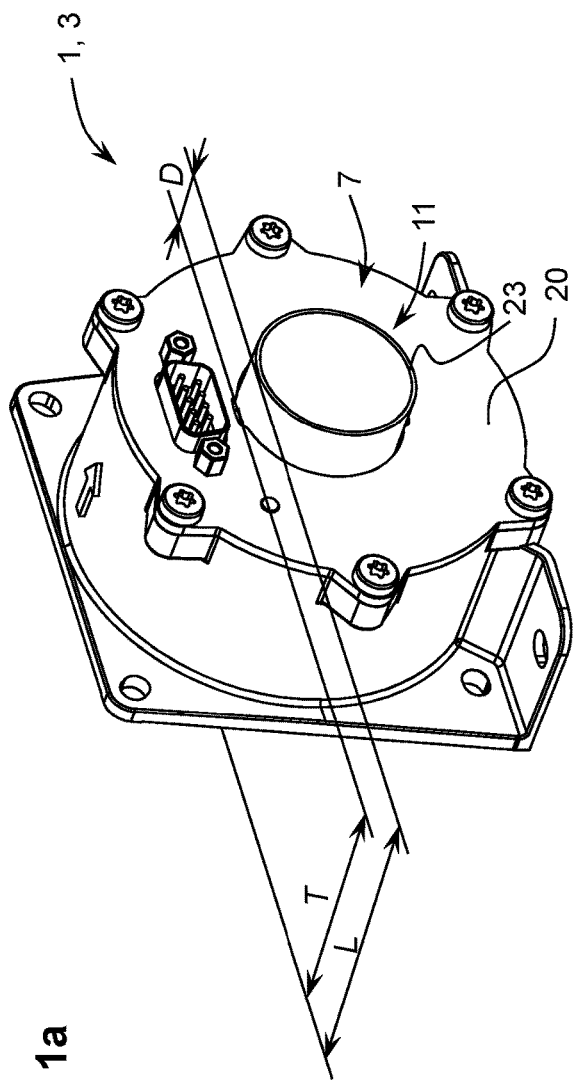
FIGS. 1a and 1b illustrate perspective views of a current transducer according to an embodiment of the invention.
Figure 1B:
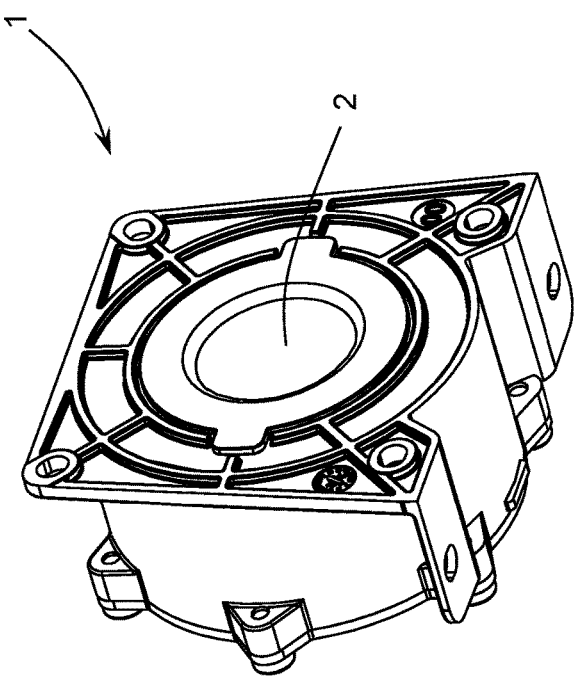
Figure 3A:
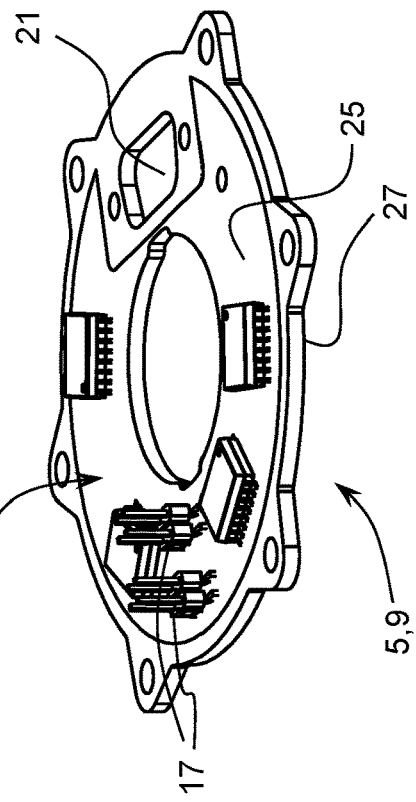
FIGS. 3a to 3c are perspective views of an electronic circuit and portions thereof of a current transducer according to an embodiment of the invention.
Figure 3C:
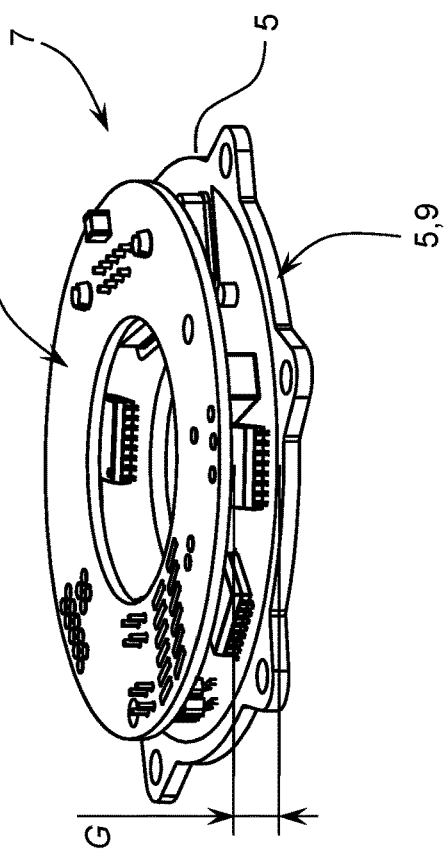

Referring to the figures, a current transducer 1 comprises a central passage 2 through which a primary conductor carrying a current to be measured (primary current) may extend. The primary conductor (not shown) may be in a form of conducting rod or bar or a cable that may further be wound around the transducer in order to pass more than one time through the central passage. Moreover, more than one primary conductor may be inserted through the central passage, for instance for the measurement of differential currents, or for the measurement of a combination of currents flowing in a plurality of primary conductors. The arrangements of primary conductors through a central passage of a current transducers with magnetic cores are per se well-known and may take many forms and do not need to be described further herein.

The current transducer 1 comprises a housing 3 comprising a base 4 having a magnetic circuit receiving cavity 12 therein and a cover 5 that may be fixed to the base over an open side of the cavity 12 to close the cavity. The cover may be fixed to the base by fixing elements such as screws 18 or may be bonded or welded to the base and preferably (but not necessarily depending on the application) comprise a seal between the cover and base.

The housing may further comprise a central passage insulator sleeve 11 to provide or to increase electrical insulation between the primary conductor and the housing 3 of the transducer. The insulator sleeve 11 may advantageously extend along a length L that is greater than the axial thickness T of the housing such that end 23 of the sleeve projects a certain distance D beyond an outer face 20 of the cover 7. This ensures a good insulation with a long creepage path between the primary conductor and the cover 5, which as shall be described hereinafter, comprises a metallic outer substrate layer.

The magnetic circuit comprises a circuit magnetic core (not visible) surrounded by at least one coil 6. The at least one coil includes a compensation coil configured to carry a compensation current intended to cancel the magnetic field generated by the current flowing in the primary conductor (s).

The current transducer further comprises a magnetic field detector (not visible) that may be in the form of a pickup coil wound around the magnetic core, or in a form of a magnetic field detector such as a Hall effect detector mounted in an airgap of the magnetic core (not visible), or if the core does not comprise an airgap, a magnetic field detector mounted adjacent the magnetic core or within an indent formed in the magnetic core. The magnetic field detector may be a Hall effect detector as mentioned or a fluxgate detector or various other types of magnetic field detectors that are per se well-known. The construction of the coil, magnetic core and various elements may be provided in various configurations that are per se well-known in the art. The coil 6 and magnetic core may be covered by an insulating potting material filled within the cavity 12, as per se well-known in the art of current transducers.

The current transducer further comprises an electronic circuit 7 that is connected to the magnetic field detector and to the one or more coils 6. The electronic circuit is also connected to a connector 10 or to a cable (not shown) for connection of the transducer to an external circuit that requires the current measurement signal outputted by the current transducer 1.

The electronic circuit 7 comprises at least two circuit boards 8, 9, a first circuit board 8 having circuit components thereon and a second circuit board 9 also having circuit components thereon including at least one or more power amplifiers 15. The first and second circuit boards are arranged in a stacked manner spaced apart by a gap G and interconnected by electrical terminals 17, for instance in a form of pin terminals, for the transmission of signals and power to and from the circuit boards. Other types of connections may be provided between the circuit boards, for instance an optical interconnection.

The connector 10 may be mounted on the first circuit board 8 and extend through an orifice 21 in the second circuit board for presenting a connector plug accessible from the outside of the housing 3 for pluggable connection to an external connector. The connector 10 may also perform the function of a spacer between the first and second circuit boards 8, 9.

The first circuit board 8 comprises a circuit board substrate, for instance a conventional substrate used for printed circuit boards comprising a multilayer epoxy resin structure. The circuit components mounted on the first circuit board may in particular comprise signal processing components for measuring the output of the magnetic field detector, driving an excitation coil in case the magnetic field detector comprises a fluxgate sensor, and processing the feedback signal for driving the compensation coil.

The second circuit board 9 comprises one or more power amplifiers 15 that amplify the signal injected into the one or more compensation coils 6. Generation of the current required to drive the compensation coils in particular for measuring large primary currents, generates heat in the power amplifiers that needs to be evacuated for stable operation of the transducer.

According to an aspect of the invention, the second circuit board 9 in which the one or more power amplifiers 15 are mounted, comprises a circuit substrate layer 25 mounted directly on a metal support substrate 27. The metal support substrate 27 forms an outer layer of the cover 5 that also provides a mechanical support structure and rigidity to the cover 5. The circuit substrate layer 25 has an insulating material and conductive circuit traces in or on the insulating material for interconnection of circuit components mounted on the circuit substrate layer.

Figure 4:
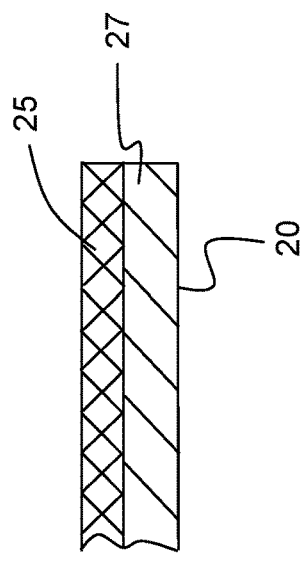
FIG. 4 is a detailed schematic cross section view of a portion of circuit board integrated in a housing cover according to an embodiment of the invention.
Figure 3B:
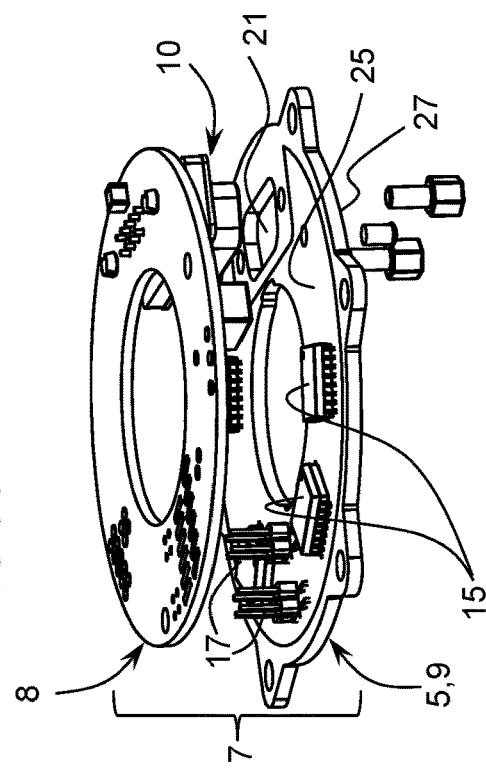

The metal support substrate 27 may be in the form of a flat piece of metal on which the insulating circuit substrate layer 25 of the second circuit board 9 is mounted as schematically illustrated in FIG. 4, or comprise an inner side recess forming a shallow cavity within which the insulating circuit substrate layer of the second circuit board 9 is mounted. The second circuit board 9 is thus integrated into the cover 5 as an integral inseparable part the metallic support substrate, comprising fixing portions such as a flange with screw or rivet holes for fixing to the base 4.

Integration of the second circuit board 9 comprising one or more power amplifiers 15 as part of the housing cover 5 thus provides excellent heat transfer from the power amplifiers to the metallic layer of the cover for cooling of the transducer in a very compact form. Moreover, the separation of the signal processing components on a first circuit board 8 spaced by a gap G from the second circuit board 9 within the cover 5 ensures a low heat transfer between the two circuit boards and between the power amplifiers and the other circuit components, thus increasing the thermal stability of the signal processing circuit components. In other words, the signal processing components are subject to less heat and thermal variations due to operations of the power amplifiers by separating into two different circuit boards and having power amplifiers on the metallic cover for effective heat evacuation and reducing the buildup of heat within the transducer.

It may be noted that instead of having pin interconnections 17 between the two circuit boards, a pluggable connection may also be provided such that the cover may be removed and put back, or simply to facilitate manufacturing assembly of the transducer.

LIST OF REFERENCED FEATURES

Current transducer 1
  Central passage 2
  Housing 3

Base 4
　Coil receiving cavity 12
　Potting material
Cover 5
　Fixing elements (e.g. screws) 18
　Outer face 20
　Connector orifice 21
　Circuit substrate layer 25
　Metal support substrate 27
　　Inner face
　　Recess
　Central passage insulator sleeve 11
　　End 23
Compensation coil 6
Electronic circuit 7
　First circuit board 8
　　Circuit components 13
　Second circuit board 9
　　Circuit component
　　　Power amplifier(s) 15
　Fixing elements 18
　Electrical interconnections 17
Magnetic core
Magnetic field detector
Connector 10

The invention claimed is:

1. A current transducer comprising a housing including a base and a cover, a magnetic circuit mounted within a cavity of the base, the magnetic circuit comprising a magnetic core and a least one coil wound around the magnetic core, and an electric circuit comprising a first circuit board mounted within the housing, the first circuit board comprising a signal processing circuit connected to a magnetic field detector and to the coil, wherein the current transducer further comprises a second circuit board comprising one or more power amplifiers mounted thereon, the second circuit board being integrated on an inner side of a metallic support substrate, the metal support substrate forming an outer layer of said cover, the metallic support substrate fixed to the base to cover the cavity of the base therein with the second circuit board forming an inner side of the cover facing the first circuit board, the first and second circuit boards interconnected electrically by electrical interconnections.

2. The current transducer according to claim 1, wherein the current transducer is a closed-loop current transducer and the coil is a compensation coil configured for carrying a compensation current seeking to cancel a magnetic field generated by the current to be measured.

3. The current transducer according to claim 2, wherein the metallic support substrate is a flat sheet of metal.

4. The current transducer according to claim 2, wherein the second circuit board comprises a flat insulating substrate.

5. The current transducer according to claim 2, wherein the metallic support substrate is made of aluminum or aluminum alloy.

6. The current transducer according to claim 2, wherein the electronic circuit comprises one or more spacer elements mounted between the first and second circuit boards to define and stabilize a gap therebetween.

7. The current transducer according to claim 2, further comprising a connector mounted on the first circuit board and extending therefrom through the second circuit board and metallic support substrate having an orifice therefor, presenting a pluggable interface or connection to an external connector.

\* \* \* \* \*